(12) United States Patent
Liu et al.

(10) Patent No.: US 7,232,514 B2
(45) Date of Patent: *Jun. 19, 2007

(54) METHOD AND COMPOSITION FOR POLISHING A SUBSTRATE

(75) Inventors: Feng Q. Liu, San Jose, CA (US); Stan D. Tsai, Fremont, CA (US); Yongqi Hu, Campbell, CA (US); Siew S. Neo, Santa Clara, CA (US); Yan Wang, Sunnyvale, CA (US); Alain Duboust, Sunnyvale, CA (US); Liang-Yuh Chen, Foster City, CA (US)

(73) Assignee: Applied Materials, Inc., Santa Clara, CA (US)

(*) Notice: Subject to any disclaimer, the term of this patent is extended or adjusted under 35 U.S.C. 154(b) by 363 days.

This patent is subject to a terminal disclaimer.

(21) Appl. No.: 10/456,220

(22) Filed: Jun. 6, 2003

(65) Prior Publication Data

US 2003/0234184 A1    Dec. 25, 2003

Related U.S. Application Data

(66) Substitute for application No. 10/032,275, filed on Dec. 21, 2001, now Pat. No. 6,899,804, and a continuation-in-part of application No. 10/038,066, filed on Jan. 3, 2002, now Pat. No. 6,811,680, which is a continuation-in-part of application No. 10/378,097, filed on Feb. 26, 2003.

(60) Provisional application No. 60/359,746, filed on Feb. 26, 2002, provisional application No. 60/275,874, filed on Mar. 14, 2001.

(51) Int. Cl.
C25F 3/00    (2006.01)

(52) U.S. Cl. .................... 205/668; 205/682

(58) Field of Classification Search ............... 205/668, 205/674, 682, 684; 204/224 M
See application file for complete search history.

(56) References Cited

U.S. PATENT DOCUMENTS 2,582,020 A    1/1952    Emery .................. 204/140.5

(Continued)

FOREIGN PATENT DOCUMENTS

EP    0 527 537    2/1993

(Continued)

OTHER PUBLICATIONS

PCT Written Opinion for PCT/US02/04806, dated Mar. 9, 2004. (AMAT/5699.PC).

(Continued)

*Primary Examiner*—Patrick Joseph Ryan
*Assistant Examiner*—Thomas H. Parsons
(74) *Attorney, Agent, or Firm*—Patterson & Sheridan

(57) ABSTRACT

Polishing compositions and methods for removing conductive materials from a substrate surface are provided. In one aspect, a composition includes an acid based electrolyte system, one or more chelating agents, one or more corrosion inhibitors, one or more inorganic or organic acid salts, one or more pH adjusting agents to provide a pH between about 2 and about 10, a polishing enhancing material selected from the group of abrasive particles, one or more oxidizers, and combinations thereof, and a solvent. The composition may be used in an conductive material removal process including disposing a substrate having a conductive material layer formed thereon in a process apparatus comprising an electrode, providing the composition between the electrode and substrate, applying a bias between the electrode and the substrate, and removing conductive material from the conductive material layer.

63 Claims, 1 Drawing Sheet

U.S. PATENT DOCUMENTS

| | | | |
|---|---|---|---|
| 3,239,441 A | 3/1966 | Marosi | |
| 3,873,512 A | 3/1975 | Latanision | 204/129.46 |
| 4,263,113 A | 4/1981 | Bernard | 204/146 |
| 4,663,005 A | 5/1987 | Edson | 204/129.85 |
| 4,666,683 A | 5/1987 | Brown et al. | |
| 4,793,895 A | 12/1988 | Kaanta et al. | |
| 4,934,102 A | 6/1990 | Leach et al. | |
| 4,992,135 A | 2/1991 | Doan | |
| 5,002,645 A | 3/1991 | Eastland et al. | |
| 5,096,550 A | 3/1992 | Mayer et al. | 204/129.1 |
| 5,114,548 A | 5/1992 | Rhoades | |
| 5,129,981 A | 7/1992 | Wang et al. | 156/628 |
| 5,209,816 A | 5/1993 | Yu et al. | |
| 5,217,586 A | 6/1993 | Datta et al. | 204/129.6 |
| 5,225,034 A | 7/1993 | Yu et al. | 156/636 |
| 5,256,565 A | 10/1993 | Bernhardt et al. | 437/228 |
| 5,340,370 A | 8/1994 | Cadien et al. | |
| 5,391,258 A | 2/1995 | Brancaleoni et al. | |
| 5,407,526 A | 4/1995 | Danielson et al. | |
| 5,534,106 A | 7/1996 | Cote et al. | 156/636.1 |
| 5,543,032 A | 8/1996 | Datta et al. | |
| 5,567,300 A | 10/1996 | Datta et al. | 205/652 |
| 5,575,706 A | 11/1996 | Tsai et al. | 451/41 |
| 5,770,095 A | 6/1998 | Sasaki et al. | |
| 5,783,489 A | 7/1998 | Kaufman et al. | |
| 5,807,165 A | 9/1998 | Uzoh et al. | 451/41 |
| 5,846,882 A | 12/1998 | Birang | |
| 5,866,031 A | 2/1999 | Carpio et al. | 252/79.1 |
| 5,880,003 A | 3/1999 | Hayashi | |
| 5,897,375 A * | 4/1999 | Watts et al. | 438/693 |
| 5,911,619 A | 6/1999 | Uzoh et al. | 451/5 |
| 5,954,997 A | 9/1999 | Kaufman et al. | 252/79.1 |
| 6,001,730 A | 12/1999 | Farkas et al. | |
| 6,004,880 A | 12/1999 | Liu et al. | 438/692 |
| 6,056,864 A | 5/2000 | Cheung | 205/222 |
| 6,063,306 A | 5/2000 | Kaufman et al. | |
| 6,066,030 A | 5/2000 | Uzoh | |
| 6,077,412 A | 6/2000 | Ting et al. | 205/143 |
| 6,083,840 A | 7/2000 | Mravic et al. | |
| 6,090,239 A | 7/2000 | Liu et al. | 156/345 |
| 6,096,652 A | 8/2000 | Watts et al. | 438/692 |
| 6,099,064 A | 8/2000 | Lund | |
| 6,103,096 A | 8/2000 | Datta et al. | |
| 6,117,775 A | 9/2000 | Kondo et al. | |
| 6,117,783 A | 9/2000 | Small et al. | |
| 6,117,853 A | 9/2000 | Sakai et al. | 514/78 |
| 6,126,853 A | 10/2000 | Kaufman et al. | 252/79.1 |
| 6,143,155 A | 11/2000 | Adams et al. | 205/87 |
| 6,143,656 A | 11/2000 | Yang et al. | 438/687 |
| 6,153,043 A | 11/2000 | Edelstein et al. | 156/345 |
| 6,171,352 B1 | 1/2001 | Lee et al. | |
| 6,176,992 B1 | 1/2001 | Talieh | |
| 6,177,026 B1 | 1/2001 | Wang et al. | 252/79.1 |
| 6,190,237 B1 | 2/2001 | Huynh et al. | 451/41 |
| 6,194,317 B1 | 2/2001 | Kaisaki et al. | 438/692 |
| 6,206,756 B1 | 3/2001 | Chopra et al. | 451/28 |
| 6,217,416 B1 | 4/2001 | Kaufman et al. | 451/41 |
| 6,218,305 B1 | 4/2001 | Hosali et al. | 438/691 |
| 6,234,870 B1 | 5/2001 | Uzoh et al. | 451/8 |
| 6,238,592 B1 | 5/2001 | Hardy et al. | |
| 6,248,222 B1 | 6/2001 | Wang | |
| 6,258,711 B1 | 7/2001 | Laursen | |
| 6,258,721 B1 | 7/2001 | Li et al. | 438/693 |
| 6,273,786 B1 | 8/2001 | Chopra et al. | |
| 6,276,996 B1 | 8/2001 | Chopra | 451/41 |
| 6,293,848 B1 * | 9/2001 | Fang et al. | 451/36 |
| 6,303,049 B1 | 10/2001 | Lee et al. | |
| 6,303,551 B1 | 10/2001 | Li et al. | |
| 6,310,019 B1 | 10/2001 | Kakizawa et al. | |
| 6,315,803 B1 | 11/2001 | Ina et al. | |
| 6,315,883 B1 | 11/2001 | Mayer et al. | |
| 6,348,076 B1 | 2/2002 | Canaperi et al. | 51/309 |
| 6,354,916 B1 | 3/2002 | Uzoh et al. | |
| 6,355,075 B1 | 3/2002 | Ina et al. | |
| 6,355,153 B1 | 3/2002 | Uzoh et al. | |
| 6,375,693 B1 | 4/2002 | Cote et al. | |
| 6,391,166 B1 | 5/2002 | Wang | 204/224 R |
| 6,395,152 B1 | 5/2002 | Wang | 204/224 M |
| 6,416,685 B1 | 7/2002 | Zhang et al. | |
| 6,419,554 B2 | 7/2002 | Chopra et al. | |
| 6,428,721 B1 | 8/2002 | Ina et al. | |
| 6,429,133 B1 | 8/2002 | Chopra | |
| 6,440,186 B1 | 8/2002 | Sakai et al. | |
| 6,440,295 B1 | 8/2002 | Wang | 205/640 |
| 6,449,371 B1 | 9/2002 | Tan et al. | |
| 6,454,819 B1 | 9/2002 | Yano et al. | |
| 6,455,479 B1 | 9/2002 | Sahbari | |
| 6,508,952 B1 | 1/2003 | Lee et al. | |
| 6,541,384 B1 | 4/2003 | Sun et al. | |
| 6,551,935 B1 | 4/2003 | Sinha et al. | |
| 6,555,158 B1 | 4/2003 | Yoshio et al. | |
| 6,562,719 B2 | 5/2003 | Kondo et al. | |
| 6,565,619 B1 | 5/2003 | Asano et al. | |
| 6,568,997 B2 * | 5/2003 | Costas et al. | 451/41 |
| 6,579,153 B2 | 6/2003 | Uchikura et al. | |
| 6,593,239 B2 | 7/2003 | Kaufman et al. | |
| 6,593,638 B1 | 7/2003 | Kondo et al. | |
| 6,602,112 B2 | 8/2003 | Tran et al. | |
| 6,605,537 B2 | 8/2003 | Bian et al. | |
| 6,616,976 B2 | 9/2003 | Montano et al. | |
| 6,620,215 B2 | 9/2003 | Li et al. | |
| 6,676,484 B2 | 1/2004 | Chopra | |
| 6,679,928 B2 | 1/2004 | Costas et al. | |
| 6,679,929 B2 | 1/2004 | Asano et al. | |
| 6,693,036 B1 | 2/2004 | Nogami et al. | |
| 6,867,136 B2 | 3/2005 | Basol et al. | |
| 6,893,476 B2 | 5/2005 | Siddiqui et al. | |
| 6,946,066 B2 | 9/2005 | Basol et al. | |
| 2001/0016469 A1 | 8/2001 | Chopra | |
| 2001/0024878 A1 | 9/2001 | Nakamura et al. | |
| 2001/0036746 A1 | 11/2001 | Sato et al. | 438/745 |
| 2001/0042690 A1 | 11/2001 | Talieh et al. | |
| 2001/0052351 A1 | 12/2001 | Brown et al. | |
| 2002/0008036 A1 | 1/2002 | Wang | 205/118 |
| 2002/0016064 A1 | 2/2002 | Komai et al. | |
| 2002/0016272 A1 | 2/2002 | Kakizawa et al. | |
| 2002/0040100 A1 | 4/2002 | Kume et al. | 525/89 |
| 2002/0070126 A1 | 6/2002 | Sato et al. | |
| 2002/0072309 A1 | 6/2002 | Sato et al. | |
| 2002/0074230 A1 | 6/2002 | Basoi | |
| 2002/0088709 A1 | 7/2002 | Hongo et al. | |
| 2002/0096659 A1 | 7/2002 | Sakai et al. | |
| 2002/0104764 A1 | 8/2002 | Gautam et al. | |
| 2002/0108861 A1 | 8/2002 | Emesh et al. | |
| 2002/0130049 A1 | 9/2002 | Chen et al. | |
| 2002/0139055 A1 | 10/2002 | Asano et al. | |
| 2002/0160698 A1 | 10/2002 | Sato et al. | |
| 2002/0182982 A1 | 12/2002 | Jui-Lung et al. | |
| 2003/0038038 A1 | 2/2003 | Basol et al. | |
| 2003/0073311 A1 | 4/2003 | Joseph et al. | |
| 2003/0073386 A1 | 4/2003 | Ma et al. | |
| 2003/0079416 A1 | 5/2003 | Ma et al. | |
| 2003/0083214 A1 | 5/2003 | Kakizawa et al. | |
| 2003/0104762 A1 | 6/2003 | Sato et al. | |
| 2003/0113996 A1 | 6/2003 | Nogami et al. | |
| 2003/0114004 A1 | 6/2003 | Sato et al. | |
| 2003/0115475 A1 | 6/2003 | Russo et al. | |
| 2003/0116445 A1 | 6/2003 | Sun et al. | 205/674 |
| 2003/0116446 A1 | 6/2003 | Duboust et al. | |
| 2003/0119311 A1 | 6/2003 | Basol et al. | |
| 2003/0136055 A1 | 7/2003 | Li et al. | |
| 2003/0153184 A1 | 8/2003 | Wang et al. | |
| 2003/0170091 A1 | 9/2003 | Shomler et al. | |
| 2003/0178320 A1 | 9/2003 | Liu et al. | |

| | | | |
|---|---|---|---|
| 2003/0216045 | A1 | 11/2003 | Wang et al. |
| 2003/0234184 | A1 | 12/2003 | Liu et al. |
| 2004/0053499 | A1 | 3/2004 | Liu et al. |
| 2004/0248412 | A1 | 12/2004 | Liu et al. |
| 2005/0044803 | A1 | 3/2005 | Siddiqui et al. |
| 2005/0565378 | | 3/2005 | Chen et al. |
| 2005/0227483 | A1 | 10/2005 | Basol et al. |
| 2006/0009033 | A1 | 1/2006 | Basol et al. |
| 2006/0011485 | A1 | 1/2006 | Basol et al. |

FOREIGN PATENT DOCUMENTS

| | | |
|---|---|---|
| EP | 0 699 782 | 3/1996 |
| EP | 0 811 665 A3 | 12/1997 |
| EP | 0 846 742 A2 | 6/1998 |
| EP | 0846742 * | 6/1998 |
| EP | 1 170 761 | 3/2000 |
| EP | 1 103 346 A2 | 5/2001 |
| EP | 1103346 * | 5/2001 |
| EP | 1 167 585 | 1/2002 |
| EP | 1 170 761 A1 | 9/2002 |
| EP | 1 410430 | 4/2004 |
| JP | 58-093886 | 6/1983 |
| JP | 58-093899 | 6/1983 |
| JP | 05 302199 | 11/1993 |
| JP | 06 158397 | 6/1994 |
| JP | 10 121297 | 5/1998 |
| JP | 2000 192298 | 7/2000 |
| JP | 2000 256898 | 9/2000 |
| JP | P2001-77117 A | 3/2001 |
| SU | 1 618 538 A1 | 1/1991 |
| WO | 99/04646 | 2/1998 |
| WO | 98/49723 | 11/1998 |
| WO | WO 99/46081 | 9/1999 |
| WO | WO 99/46081 A1 | 9/1999 |
| WO | WO 99/46353 | 9/1999 |
| WO | 99/53532 | 10/1999 |
| WO | 99/65072 | 12/1999 |
| WO | 00/03426 | 1/2000 |
| WO | 00/26443 | 5/2000 |
| WO | 00/55876 A1 | 9/2000 |
| WO | 01/77241 A2 | 10/2001 |
| WO | WO 01/77241 * | 10/2001 |
| WO | 02/23616 | 3/2002 |
| WO | 02/075804 A2 | 9/2002 |
| WO | WO 02-075804 | 9/2002 |
| WO | 02/88229 | 11/2002 |
| WO | WO 03/009361 | 1/2003 |
| WO | WO 03 009361 | 1/2003 |
| WO | WO 03/060962 A2 | 7/2003 |
| WO | WO 03/72672 | 9/2003 |
| WO | WO 03/087436 | 10/2003 |
| WO | WO 03/088316 | 10/2003 |

OTHER PUBLICATIONS

PCT International Search Report for PCT/US04/17691, dated Nov. 11, 2004. (AMAT/5699.PCT03).
PCT Written Opinion for PCT/US04/17691, dated Nov. 11, 2004. (AMAT/5699.PCT03).
International Search Report for PCT/US02/40754 dated Aug. 5, 2003. (AMAT/5998PC).
Chang, et al., "Microleveling Mechanisms and Applications of Electropolishing of Planarization of Copper Mettalization", J. Vac. Sci. Technol. B 20(5), Sep./Oct. 2002, pp. 2149-2152.
Chang, et al., "Superpolishing of Planarizing Copper Damascene Interconnects", Electrochemical and Solid-State Letters, pp. G72-G74 (2003).
Contolini, et al., "Electrochemical Planarization for Multilevel Metallization", J. Electrochem. Soc., vol. 141, No. 9, Sep. 1994, pp. 2503-2510.
Du, et al., Mechanism of Copper Removal During CMP in Acidic H2O2 Slurry, Journal of The Electrochemical Society, pp. G230-235 (2004).

Hu, et al. "Copper Interconnection Integration and Reliability", Thin Solid State Films, pp. 84-92, (1995).
Jin-Hua, et al., "An XPS and BAW Sensor Study of the Structure and Real-Time Growth Behavious of a Complex Surface Film on Copper in Sodium Chloride Solutions (pH=9), Containing a Low Concentration of Benzotriazole", Eletrochimica Acta, vol. 43, Nos. 3-4, pp. 265-274, 1998.
Kaufman, et al., "Chemical-Mechanical Polishing for Fabricating Patterned W Metal Features as Chip Interconnects", J. Electrochem. Soc., vol. 138, No. 11, Nov. 1991; The Electrochemical Society, Inc. pp. 3460-3465.
Padhi, et al., "Planarization of Copper Thin Films by Electropolishing in Phosphoric Acid for ULSI Applications", Journal of the Electrochemical Society, 150, pp. G10-G14 (2003).
Qafsaoui, et al., "Quantitative Characterization of Protective Films Grown on Copper in the Presence of Different Triazole Derivative Inhibitors", Electrochimica Acta 47 (2002), pp. 4339-4346.
Steigerwald, et al., "Effect of Copper Ions in the Slurry on the Chemical-Mechanical Polish Rate of Titanium", J. Electrochem. Soc., vol. 141, No. 12, Dec. 1994, pp. 3512-3516.
Tamilmani, et al., "Potential-pH Diagrams of Interest to Chemical Mechanical Planarization of Copper", Journal of The Electrochemical Society, V. 149, pp. G638-G642 (2002).
Tromans, et al., "Growth of Passivating CuBTA Films on Copper in Aqueous Chloride/Benzotriazole Solutions", Electrochemical and Solid-State Letter, V. 5, pp. B5-B8 (2002).
Wang, et al., "Inhibition Effect of AC-Treated, Mixed Self-Assembled Film of Phenylthiourea and 1-Dodecanethiol on Copper Corrosion", Journal of The Electrochemical Society, pp. B11-B15 (2004).
Nogami, "An Innovation to Integrate Porous Low-K Materials and Copper", InterConnect Japan 2001; Honeywell Seminar (Dec. 6, 2001) pp. 1-12.
D. Landolt, "Fundamental Aspects of Electropolishing", Mar. 18, 1996, pp. 1-11.
Robert J. Contolini, "Electrochemical Planarization of ULSI Copper" Jun. 1997, Solid State Technology, pp. 155-156, 158 and 160.
Partial International Search Report for US 02/40754 dated Apr. 28, 2003 (AMAT/5998.PCT).
International Search Report for US 02/04806 dated Apr. 1, 2003 (AMAT/5699.PC).
PCT International Search Report for US 03/06058 dated Jun. 25, 2003. (AMAT/5699.PC.02).
First Official Letter dated May 26, 2006 for Chinese National Application No. 03807940.2. (APPM/005699CN02).
Translation of First Official Letter dated May 26, 2006 for Chinese National Application No. 03807940.2. (APPM/005699CN02).
Du, et al. "Effect of Hydrogen Peroxide on Oxidation of Copper in CMP Slurries Containing Glycine and Cu Ions", Electrochimica Acta, pp. 4505-4512 (2004).
Economikos, et al. "Integrated Electro-Chemical Mechanical Planarization (Ecmp) for Future Generation Device Technology", 2004 IEEE, pp. 233-235.
Goonetilleke, et al. Voltage-Induced Material Removal for Electrochemical Mechanical Planarization of Copper in Electrolytes Containing $NO_3$, Glycine, and $H_2O_2$, Electrochemical and Solid-State Letters, pp. G190-G193 (2005).
Kondo, et al. "Role of Additives for Copper Damascene Electrodeposition: Experimental Study on Inhibition and Acceleration Effects", Journal of The Electrochemical Society, pp. C250-C255 (2004).
Mansikkamaki, et al. "Inhibitive Effect of Benzotriazole on Copper Surfaces Studied by SECM", Journal of the Electrochemical Society, pp. B12-B16 (2005).
PCT International Preliminary Report on Patentability and Written Opinion dated Dec. 22, 2005. (APPM/005699PC03).
International Search Report and the Written Opinion for International Application No. PCT/US2006/015386 dated Oct. 24, 2006. (APPM/005699PC05).

* cited by examiner

METHOD AND COMPOSITION FOR POLISHING A SUBSTRATE

CROSS-REFERENCE TO RELATED APPLICATIONS

This application is a continuation-in-part of U.S. patent application Ser. No. 10/032,275, filed Dec. 21, 2001, entitled "Polishing Composition and Treatment for Electrolytic Chemical Mechanical Polishing," now U.S. Pat. No. 6,899, 804, a continuation-in-part of U.S. patent application Ser. No. 10/038,066, filed Jan. 3, 2002, entitled "Planarization of Substrates Using Electrochemical Mechanical Polishing," now U.S. Pat. No. 6,811,680, which claims priority to U.S. Provisional Patent Application Ser. No. 60/275,874, filed on Mar. 14, 2001, and a continuation-in-part of co-pending U.S. patent application Ser. No. 10/378,097, filed Feb. 26, 2003, entitled "Method and Composition for Polishing a Substrate," which claims priority to U.S. Provisional Patent Application Ser. No. 60/359,746, filed on Feb. 26, 2002, entitled "Copper CMP Slurries with Organic Polymer Particles", each application is herein incorporated by reference.

BACKGROUND OF THE INVENTION

1. Field of the Invention

Embodiments of the present invention relate to compositions and methods for removing a conductive material from a substrate.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of interconnects is important to VLSI and ULSI success and to the continued effort to increase circuit density and quality of individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process where material is removed from the surface of the substrate to form a generally even, planar surface. Planarization is useful in removing excess deposited material, removing undesired surface topography, and surface defects, such as surface roughness, agglomerated materials, crystal lattice damage, scratches, and contaminated layers or materials to provide an even surface for subsequent photolithography and other semiconductor processes.

Electrochemical mechanical polishing (ECMP) is one method of planarizing a surface of a substrate. ECMP removes conductive materials, such as copper, from a substrate surface by electrochemical "anodic" dissolution and optionally reduced mechanical abrasion compared to conventional chemical mechanical planarization (CMP) processes. A typical ECMP system includes a substrate support and two electrodes disposed within a polishing composition containment basin. During the ECMP process the substrate is in electrical contact with an electrode, and generally becomes an anode during the anodic dissolution process steps. In operation, metal atoms on a surface of a substrate are ionized by an electrical current from a power source, such as a voltage source connected to the two electrodes. The metal ions dissolve into the surrounding polishing composition.

Due to the push for high tool throughput, processed substrates per hour, the goal in ECMP type processes is to maximize the electrochemical dissolution rate of the desired material from the surface of the substrate. However, ECMP processes typically have been observed to have reduced removal rates compared to conventional chemical mechanical polishing processes. Modifying the processing conditions, such as increasing pressure between a substrate and polishing pad and increasing processing time, to improve removal rate have not proven to be satisfactory in increasing removal rates and in some instances, such modifications tend to increase dishing and damage to the substrate. For example, increased polishing pressure on substrates containing low dielectric constant (low k dielectric) materials have been observed to form defects in the deposited material, such as delamination or scratches from increased shear forces.

Therefore, there is a need for compositions and methods for removing conductive material from a substrate that minimizes damage to the substrate during planarization.

SUMMARY OF THE INVENTION

Aspects of the invention provide compositions and methods for removing conductive materials by an electrochemical polishing technique. In one aspect, a composition is provided for removing at least a conductive material from a substrate surface including an acid based electrolyte system, one or more chelating agents, one or more corrosion inhibitors, one or more inorganic or organic acid salts, one or more pH adjusting agents to provide a pH between about 2 and about 10, a polishing enhancing material selected from the group of abrasive particles, one or more oxidizers, and combinations thereof, and a solvent.

In another aspect, the composition is used in a method provided for processing a substrate including disposing a substrate having a conductive material layer formed thereon in a process apparatus comprising a first electrode and a second electrode, wherein the substrate is in electrical contact with the second electrode, providing the composition between the first electrode and the substrate, applying a bias between the first electrode and the second electrode, moving the substrate and the first electrode relative to each other, and removing conductive material from the conductive material layer.

BRIEF DESCRIPTION OF THE DRAWINGS

So that the manner in which the above recited aspects of the present invention are attained and can be understood in detail, a more particular description of embodiments of the invention, briefly summarized above, may be had by reference to the embodiments thereof which are illustrated in the appended drawing.

It is to be noted, however, that the appended drawing illustrates only typical embodiments of this invention and are therefore not to be considered limiting of its scope, for the invention may admit to other equally effective embodiments.

DETAILED DESCRIPTION OF THE PREFERRED EMBODIMENT

Figure 1:
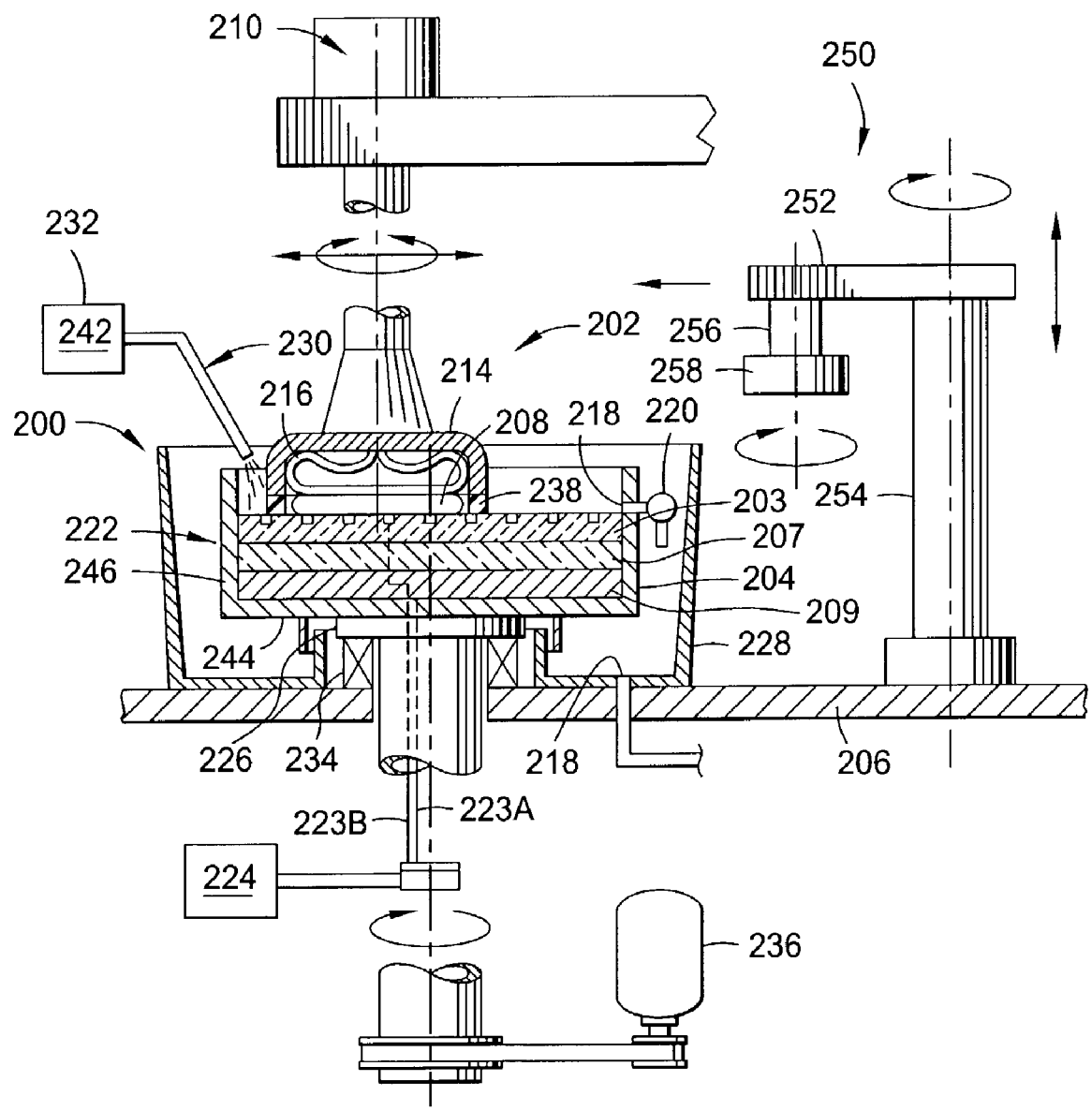

In general, aspects of the invention provide compositions and methods for removing at least a conductive material from a substrate surface. The invention is described below in reference to a planarizing process for the removal of conductive materials from a substrate surface by an electrochemical mechanical polishing (ECMP) technique.

The words and phrases used herein should be given their ordinary and customary meaning in the art by one skilled in the art unless otherwise further defined. Chemical polishing should be broadly construed and includes, but is not limited to, planarizing a substrate surface using chemical activity. Electropolishing should be broadly construed and includes, but is not limited to, planarizing a substrate by the application of electrochemical activity. Electrochemical mechanical polishing (ECMP) should be broadly construed and includes, but is not limited to, planarizing a substrate by the application of electrochemical activity, mechanical activity, chemical activity, or a combination of electrochemical, chemical, and mechanical activity to remove material from a substrate surface.

Anodic dissolution should be broadly construed and includes, but is not limited to, the application of an anodic bias to a substrate directly or indirectly which results in the removal of conductive material from a substrate surface and into a surrounding polishing composition. Polishing composition should be broadly construed and includes, but is not limited to, a composition that provides ionic conductivity, and thus, electrical conductivity, in a liquid medium, which generally comprises materials known as electrolyte components. The amount of each electrolyte component in polishing compositions can be measured in volume percent or weight percent. Volume percent refers to a percentage based on volume of a desired liquid component divided by the total volume of all of the liquid in the complete solution. A percentage based on weight percent is the weight of the desired component divided by the total weight of all of the liquid components in the complete solution.

One Apparatus Embodiment

FIG. 1 depicts a cross-sectional view of one embodiment of a "face-down" process cell 200. The process cell 200 generally includes a basin 204 and a polishing head 202. A substrate 208 is retained in the polishing head 202 and lowered into the basin 204 during processing in a face-down (e.g., backside up) orientation. An electrolyte, such as described herein, flows into the basin 204 and is in contact with the substrate's surface and a pad assembly 222, while the polishing head 202 places the substrate 208 in contact with the pad assembly 222. The basin 204 includes the pad assembly 222, a bottom 244 and sidewalls 246 that define a container that houses the pad assembly 222. The sidewalls 246 include a port 218 formed therethrough to allow removal of polishing composition from the basin 204. The port 218 is coupled to a valve 220 to selectively drain or retain the polishing composition in the basin 204.

The substrate 208 and the pad assembly 222 disposed in the basin 204 are moved relative to each other to provide a polishing motion (or motion that enhances plating uniformity). The polishing motion generally comprises at least one motion defined by an orbital, rotary, linear or curvilinear motion, or combinations thereof, among other motions. The polishing motion may be achieved by moving either or both of the polishing head 202 and/or the basin 204. The polishing head 202 may be stationary or driven to provide at least a portion of the relative motion between the basin 204 and the substrate 208 held by the polishing head 202. In the embodiment depicted in FIG. 1, the polishing head 202 is coupled to a drive system 210. The drive system 210 can generally move the polishing head 202 with at least a rotary, orbital, sweep motion, or combinations thereof. In one embodiment the basin 204 is rotated at a velocity from about 3 to about 100 rpm, and the polishing head 202 is rotated at a velocity from about 5 to about 200 rpm and also moved linearly at a velocity of about 5 to about 25 centimeters per second in a direction radial to the basin 204. The preferred ranges for a 200 mm diameter substrate are a basin 204 rotational velocity of about 5 to about 40 rpm and a polishing head 202 rotational velocity of about 7 to about 100 rpm and a linear (e.g., radial) velocity of about 10 centimeters per second. The preferred ranges for a 300 mm diameter substrate are a basin 204 rotational velocity of about 5 to about 20 rpm and a polishing head 202 rotational velocity of about 7 to about 50 rpm and a linear.(e.g., radial) velocity of about 10 centimeters per second. In one embodiment of the present invention the basin 204's diameter can range from about 17 to about 30 inches and the distance the polishing head 202 moves along the radius of the basin 204 can be from about 0.1 to about 2 inches.

The polishing head 202 generally retains the substrate 208 during processing. In one embodiment, the polishing head 202 includes a housing 214 enclosing a bladder 216. The bladder 216 may be deflated when contacting the substrate to create a vacuum therebetween, thus securing the substrate to the polishing head 202 to allow placement and removal of the substrate. The bladder 216 may additionally be inflated and pressurized to bias and assure contact between the substrate and the pad assembly 222 retained in the basin 204. A retaining ring 238 is coupled to the housing 214 and circumscribes the substrate 208 to prevent the substrate from slipping out from the polishing head 202 while processing. One polishing head that may be adapted to benefit from the invention is a TITAN HEAD™ carrier head available from Applied Materials, Inc., located in Santa Clara, Calif. Another example of a polishing head that may be adapted to benefit from the invention is described in U.S. Pat. No. 6,159,079, issued Dec. 12, 2001, which is hereby incorporated herein by reference in its entirety.

The basin 204 is generally fabricated from a plastic such as fluoropolymers, TEFLON® polymers, perfluoroalkoxy resin (PFA), polyethylene-based plastics (PE), sulfonated polyphenylether sulfones (PES), or other materials that are compatible or non-reactive with the polishing composition or other chemicals used in the processing cell 200. The basin 204 is rotationally supported above a base 206 by bearings 234. A drive system 236 is coupled to the basin 204 and rotates the basin 204 during processing. A catch basin 228 is disposed on the base 206 and circumscribes the basin 204 to collect processing fluids, such as a polishing composition, that flow out of port 218 disposed through the basin 204 during and/or after processing. An outlet drain (not shown) and outlet valve (not shown) are incorporated in the invention to allow the polishing composition in the catch basin to be sent to a reclaim system (not shown) or a waste drain (not shown).

A polishing composition delivery system 232 is generally disposed adjacent the basin 204. The polishing composition delivery system 232 includes a nozzle or outlet 230 coupled to a polishing composition source 242. The outlet 230 delivers polishing composition or other processing fluids from the polishing composition source 242 into the basin 204. Alternatively, the polishing composition delivery system may provide polishing composition through an inlet (not shown) in the bottom 244 of the process cell, thus allowing polishing composition to flow through the pad assembly 222 to contact the conductive pad 203 and substrate 208. The polishing composition source 242 schematically shown here generally includes a source of all of the chemicals required to supply and support the polishing composition during processing. It is further contemplated in one embodiment of the current design to continually recirculate the polishing composition through the pad assembly 222 and across the surface of the substrate 208. In one embodiment the flow rate of polishing composition flowing through the process cell 200 is between about 0.1 to about 2 liters per minute.

Optionally, and shown in FIG. 1, a conditioning device 250 may be provided proximate the basin 204 to periodically condition or regenerate the pad assembly 222. Typically, the conditioning device 250 includes an arm 252 coupled to a stanchion 254 that is adapted to position and sweep a conditioning element 258 across pad assembly 222. The conditioning element 258 is coupled to the arm 252 by a shaft 256 to allow clearance between the arm 252 and sidewalls 246 of the basin 204 while the conditioning element 258 is lowered to contact the pad assembly 222. The conditioning element 258 is typically a diamond or silicon carbide disk, which may be patterned to enhance working the surface of the pad assembly 222 into a predetermined surface condition/state that enhances process uniformity. One conditioning element 258 that may be adapted to benefit from the invention is described in U.S. patent application Ser. No. 09/676,280, filed Sep. 28, 2000 by Li et al., now abandoned, which is incorporated herein by reference to the extent not inconsistent with the claims aspects and description herein.

A power source 224 is coupled to the pad assembly 222 by electrical leads 223A, 223B. The power source 224 applies an electrical bias to the pad assembly 222 to drive an electrochemical process described below. The leads 223A, 223B are routed through a slip ring 226 disposed below the basin 204. The slip ring 226 facilitates continuous electrical connection between the power source 224 and electrodes (209 and 203) in the pad assembly 222 as the basin 204 rotates. The leads 223A, 223B may be wires, tapes or other conductors compatible with process fluids or having a covering or coating that protects the leads from the process fluids. Examples of materials that may be utilized in the leads 223A, 223B include copper, graphite, titanium, platinum, gold, and HASTELOY® among other materials which can have an insulating coating on its exterior surface. Coatings disposed around the leads may include polymers such as fluorocarbons, PVC, polyamide, and the like. The slip ring 226 can be purchased from such manufacturers as IDM Electronics LTD, Reading Berkshire, England, a division of Kaydon Corporation, Ann Arbor, Mich.

The pad assembly 222 generally includes a conductive pad 203 coupled to a backing 207, and an electrode 209. The backing 207 may also be coupled to an electrode 209. The conductive pad 203 and the backing 207 have a plurality of holes or pores therein to allow the polish composition to make contact with, and thus provide a conductive path between the substrate 208 and the electrode 209. A dielectric insert (not shown) may be disposed between the conductive pad 203 and the backing 207 or between the backing 207 and the electrode 209 to regulate the electrolyte flow through all or a portion of the conductive pad 203, by use of a plurality of holes or pores formed therein. The conductive pad 203 is used to apply a uniform bias to the substrate surface by use of a conductive surface that makes contact with the surface of the substrate. The use of a conductive pad is generally preferred over the use of a conventional substrate contacting means such as discrete or point contacts, but should not be considered limiting to the scope of the present invention. During the anodic dissolution process the electrode 209 is generally biased as a cathode and the conductive pad 203, and substrate 208, are biased as an anode through use of the power supply 224. Examples of the conductive pad 203 are more fully disclosed in U.S. patent application Ser. No. 10/033,732, filed on Dec. 27, 2001, which is incorporated by reference herein to the extent not inconsistent with the claimed aspects and disclosure herein. Examples of an embodiment of the conductive pad 203 utilizing conventional polishing material (non-conductive) with discrete contacts are more fully disclosed in the U.S. patent application Ser. No. 10/211,626, filed on Aug. 02, 2002, which is incorporated by reference herein to the extent not inconsistent with the claimed aspects and disclosure herein.

As the pad assembly 222 includes elements comprising both an anode and cathode of an electrochemical cell, both the anode and a cathode may be replaced simultaneously by simply removing a used pad assembly 222 from the basin 204 and inserting a new pad assembly 222 with fresh electrical and supporting components into the basin 204. The face-down polishing apparatus is more fully disclosed in U.S. patent application Ser. No. 10/151,538, filed May 16, 2002, entitled "Method and Apparatus for Substrate Polishing," now abandoned, commonly assigned to Applied Materials Inc., of which paragraphs 25–81 are incorporated herein by reference to the extent not inconsistent with the claims aspects and description herein.

Typically, the conductive pad 203, the backing 207, optionally, the dielectric insert, and the electrode 209 are secured together to form a unitary body that facilitates removal and replacement of the pad assembly 222 from the basin 204. The conductive pad 203, the backing 207, optionally the dielectric insert, and/or the electrode 209 may be coupled by use of methods such as adhesive bonding, thermal bonding, sewing, binding, heat staking, riveting, by use of fasteners and clamping, among others.

The process cell 200 may be disposed on a polishing platform, such as the Reflexion® CMP System, the Mirra™CMP system, and the Mirra™ Mesa CMP System, which are commercially available from Applied Materials, Inc., of Santa Clara, Calif. Additionally, any system enabling electrochemical mechanical polishing using the method or composition described herein can be used to advantage.

Polishing Composition and Process

In one aspect, polishing compositions that can planarize metals, such as copper, are provided. Generally, the polishing composition comprises an acid based electrolyte system, one or more chelating agents, one or more corrosion inhibitors, one or more inorganic or organic acid salts, one or more pH adjusting agents, to produce a pH between about 2 and about 10, a polishing enhancing material selected from the group of abrasive particles, one or more oxidizers, and combinations thereof, and a solvent. It is believed that the polishing compositions described herein improve the effective removal rate of materials from the substrate surface, such as copper, during ECMP, with a reduction in planarization type defects and yielding a smoother substrate surface.

Although the polishing compositions are particularly useful for removing copper, it is believed that the polishing compositions also may be used for the removal of other conductive materials, such as aluminum, platinum, tungsten, titanium, titanium nitride, tantalum, tantalum nitride, cobalt, gold, silver, ruthenium and combinations thereof. Mechanical abrasion, such as from contact with the conductive pad 203 and/or abrasives, may be used to improve planarity and improve removal rate of these conductive materials.

The polishing composition includes an acid based electrolyte system for providing electrical conductivity. Suitable acid based electrolyte systems include, for example, sulfuric acid based electrolytes, phosphoric acid based electrolytes, perchloric acid based electrolytes, nitric acid based electrolytes, acetic acid based electrolytes, and combinations thereof. Suitable acid based electrolyte systems include an acid electrolyte, such as phosphoric acid and/or sulfuric acid, as well as acid electrolyte derivatives, including ammonium and potassium salts thereof. The acid based electrolyte system may also buffer the composition to maintain a desired pH level for processing a substrate.

Examples of suitable acid based electrolytes include compounds having a phosphate group ($PO_4^{3-}$), such as, phosphoric acid, potassium phosphate ($K_xPO_4$) (x=1, 2, 3), copper phosphate, ammonium dihydrogen phosphate (($NH_4$)$_2H_2PO_4$), diammonium hydrogen phosphate (($NH_4$) $HPO_4$), and compounds having a sulfate group ($SO_4^{2-}$), such as sulfuric acid ($H_2SO_4$), ammonium hydrogen sulfate ($NH_4HSO_4$), ammonium sulfate, potassium sulfate, copper sulfate, nitric acid, or combinations thereof. The invention also contemplates that conventional electrolytes known and unknown may also be used in forming the composition described herein using the processes described herein.

The acid based electrolyte system may contains an acidic component that can take up about 1 to about 30 percent by weight (wt. %) or volume (vol %) of the total composition of solution to provide suitable conductivity for practicing the processes described herein. Examples of acidic components are, dihydrogen phosphate and/or diammonium hydrogen phosphate may be present in the polishing composition in amounts between about 15 and about 25 percent by weight. Alternately, phosphoric acid may be present in concentrations up to 30 wt. %, for example, between about 2 wt. % and about 6 wt. %.

One aspect or component of the present invention is the use of one or more chelating agents to complex with the surface of the substrate to enhance the electrochemical dissolution process. In any of the embodiments described herein, the chelating agents can bind to a conductive material, such as copper ions, increase the removal rate of metal materials and/or improve dissolution uniformity across the substrate surface. The chelating agents may also be used to buffer the polishing composition to maintain a desired pH level for processing a substrate.

The one or more chelating agents can include compounds having one or more functional groups selected from the group of amine groups, amide groups, carboxylate groups, dicarboxylate groups, tri-carbdxylate groups, hydroxyl groups, a mixture of hydroxyl and carboxylate groups, and combinations thereof. The one or more chelating agents may also include salts of the chelating agents described herein. The metal materials for removal, such as copper, may be in any oxidation state, such as 0, 1, or 2, before, during or after ligating with a functional group. The functional groups can bind the metal materials created on the substrate surface during processing and remove the metal materials from the substrate surface. The polishing composition may include one or more chelating agents at a concentration between about 0.1% and about 15% by volume or weight, but preferably utilized between about 0.1% and about 4% by volume or weight. For example, about 2% by volume of ethylenediamine may be used as a chelating agent. Further examples of suitable chelating agents include compounds having one or more amine and amide functional groups, such as ethylenediamine, diethylenetriamine, diethylenetriamine derivatives, hexadiamine, amino acids, ethylenediaminetetraacetic acid, methylformamide, or combinations thereof.

Examples of suitable chelating agents having one or more carboxylate groups include citric acid, tartaric acid, succinic acid, oxalic acid, and combinations thereof. Other suitable acids having one or more carboxylate groups include acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, and combinations thereof.

In any of the embodiments described herein, the inorganic or organic acid salts may be used to perform as a chelating agent. The polishing composition may include one or more inorganic or organic salts at a concentration between about 0.1% and about 15% by volume or weight of the composition, for example, between about 0.1% and about 8% by volume or weight. For example, about 2% by weight of ammonium citrate may be used in the polishing composition.

Examples of suitable inorganic or organic acid salts include ammonium and potassium salts or organic acids, such as ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof. Additionally, ammonium and potassium salts of the carboxylate acids may also be used.

In any of the embodiments described herein, the corrosion inhibitors can be added to reduce the oxidation or corrosion of metal surfaces by forming a layer of material which minimizes the chemical interaction between the substrate surface and the surrounding electrolyte. The layer of material formed by the corrosion inhibitors thus tends to suppress or minimize the electrochemical current from the substrate surface to limit electrochemical deposition and/or dissolution. The polishing composition may include between about 0.001% and about 5.0% by weight of the organic compound from one or more azole groups. The commonly preferred range being between about 0.2% and about 0.4% by weight.

Examples of organic compounds having azole groups include benzotriazole, mercaptobenzotriazole, 5-methyl-1-benzotriazole, and combinations thereof. Other suitable corrosion inhibitors include film forming agents that are cyclic compounds, for example, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. Other corrosion inhibitors include urea and thiourea among others.

Alternatively, polymeric inhibitors, for non-limiting examples, polyalkylaryl ether phosphate or ammonium nonylphenol ethoxylate sulfate, may be used in replacement or conjunction with azole containing corrosion inhibitors in an amount between about 0.002% and about 1.0% by volume or weight of the composition.

One or more pH adjusting agents is preferably added to the polishing composition to achieve a pH between about 2 and about 10, and preferably between a pH of about 4 and about 6. The amount of pH adjusting agent can vary as the concentration of the other components is varied in different formulations, but in general the total solution may include up to about 70 wt. % of the one or more pH adjusting agents, but preferably between about 0.2% and about 25% by volume. Different compounds may provide different pH levels for a given concentration, for example, the composition may include between about 0.1% and about 10% by volume of a base, such as potassium hydroxide, ammonium hydroxide, or combinations thereof, to provide the desired pH level. The one or more pH adjusting agents can be chosen from a class of organic acids, for example, carboxylic acids, such as acetic acid, citric acid, oxalic acid, phosphate-containing components including phosphoric acid, ammonium phosphates, potassium phosphates, and combinations thereof, or a combination thereof. Inorganic acids, such as strong acids including sulfuric acid, nitric acid, and combinations thereof, may also be used in the polishing composition.

The polishing composition includes one or more surface finish enhancing and/or removal rate enhancing materials including abrasive particles, one or more oxidizers, and combinations thereof.

Abrasive particles may be used to improve the surface finish and removal rate of conductive materials from the substrate surface during polishing. The addition of abrasive particles to the polishing composition can allow the final polished surface to achieve a surface roughness of that comparable with a conventional CMP process even at low pad pressures. Surface finish, or surface roughness, has been shown to have an effect on device yield and post polishing surface defects. Abrasive particles may comprise up to about 30 wt. % of the polishing composition during processing. A concentration between about 0.001 wt. % and about 5 wt. % of abrasive particles may be used in the polishing composition.

Suitable abrasive particles include inorganic abrasives, polymeric abrasives, and combinations thereof. Inorganic abrasive particles that may be used in the electrolyte include, but are not limited to, silica, alumina, zirconium oxide, titanium oxide, cerium oxide, germania, or any other abrasives of metal oxides, known or unknown. The typical abrasive particle size used in one embodiment of the current invention is generally between about 20 nm and about 1000 nm. Generally, suitable inorganic abrasives have a Mohs hardness of greater than 6, although the invention contemplates the use of abrasives having a lower Mohs hardness value.

The polymer abrasives described herein may also be referred to as "organic polymer particle abrasives", "organic abrasives" or "organic particles." The polymeric abrasives may comprise abrasive polymeric materials. Examples of polymeric abrasives materials include polymethylmethacrylate, polymethyl acrylate, polystyrene, polymethacrylonitrile, and combinations thereof.

The polymeric abrasives may have a Hardness Shore D of between about 60 and about 80, but can be modified to have greater or lesser hardness value. The softer polymeric abrasive particles can help reduce friction between a polishing article and substrate and may result in a reduction in the number and the severity of scratches and other surface defects as compared to inorganic particles. A harder polymeric abrasive particle may provide improved polishing performance, removal rate and surface finish as compared to softer materials.

The hardness of the polymer abrasives can be varied by controlling the extent of polymeric cross-linking in the abrasives, for example, a higher degree of cross-linking produces a greater hardness of polymer and, thus, abrasive. The polymeric abrasives are typically formed as spherical shaped beads having an average diameter between about 0.1 micron to about 20 microns, or less.

The polymeric abrasives may be modified to have functional groups, e.g., one or more functional groups, that have an affinity for, i.e., can bind to, the conductive material or conductive material ions at the surface of the substrate, thereby facilitating the ECMP removal of material from the surface of a substrate. For example, if copper is to be removed in the polishing process, the organic polymer particles can be modified to have an amine group, a carboxylate group, a pyridine group, a hydroxide group, ligands with a high affinity for copper, or combinations thereof, to bind the removed copper as substitutes for or in addition to the chemically active agents in the polishing composition, such as the chelating agents or corrosion inhibitors. The substrate surface material, such as copper, may be in any oxidation state, such as 0, 1, or 2, before, during or after ligating with a functional group. The functional groups can bind to the metal material(s) on the substrate surface to help improve the uniformity and surface finish of the substrate surface.

Additionally, the polymeric abrasives have desirable chemical properties, for example, the polymer abrasives are stable over a broad pH range and are not prone to aggregating to each other, which allow the polymeric abrasives to be used with reduced or no surfactant or no dispersing agent in the composition.

Alternatively, inorganic particles coated with the polymeric materials described herein may also be used with the polishing composition. It is within the scope of the current invention for the polishing composition to contain polymeric abrasives, inorganic abrasives, the polymeric coated inorganic abrasives, and any combination thereof depending on the desired polishing performance and results.

One or more oxidizers may be used herein to enhance the removal or removal rate of the conductive material from the substrate surface. An oxidizing agent is generally an agent that reacts with a material by accepting an electron(s). In the current embodiment the oxidizer is used to react with the surface of the substrate that is to be polished, which then aids in the removal of the desired material. For example, an oxidizer may be used to oxidize a metal layer to a corresponding oxide or hydroxide, for example, copper to copper oxide. Existing copper that has been oxidized, including $Cu^{1+}$ ions, may further be oxidized to a higher oxidation state, such as $Cu^{2+}$ ions, which may then promote the reaction with one or more of the chelating agents. Also, in some instances the oxidizing agent can be used in some chemistries (e.g., low pH) that can enhance the chemical etching of the surface of the substrate to further increase the removal rate from the anode surface. In cases where no bias is applied to the surface of the substrate the inhibitors and chelating agents will complex with the metal ions on the surface that become dislodged from the surface due to the relative motion and pressure applied by the conductive pad 203. The addition of abrasives can further improve the removal rate of the complexed metal ions due to the abrasive particles ability to increase that contact area between the conductive pad 203 and the substrate surface.

In the case of ECMP the conductive layer on the substrate surface is biased anodically above a threshold potential, by use of the power source 224 and the electrode 209, thus causing the metal on the substrate surface to "oxidize" (i.e. a metal atom gives up one or more electrons to the power source 224). The ionized or "oxidized" metal ions atoms thus dissolve into the electrolyte solution with the help of components in electrolyte. In the case where copper is the desired material to be removed, it can be oxidized to a $Cu^{1+}$ or a $Cu^{2+}$ oxidation state. Due to the presence of the inhibitors and/or chelating agents found in the polishing composition the electrochemical dissolution process of the metal ions into the electrolyte is more limited than a polishing composition which does not contain these components. The presence of the inhibitors and/or chelating agents also appears to have an effect on the attachment strength of the metal ion(s) and inhibitor and/or chelating agent complex to the surface of the substrate. It has been found that in one embodiment that the removal rate in an ECMP process can be increased by the addition of an oxidizing agent. It is thought that the oxidizing agent tends to further oxidize the metal ions created due to the anodic bias, which in the case of copper brings it to the more stable $Cu^{2+}$ oxidation state. The inhibitors and/or chelating agents found in the polishing composition then complex with the oxidized metal ions which tends to have a lower attachment, or bond, strength due to the way the inhibitor bonds to the oxidized metal ion and metal surface. The lower attachment strength allow the complexed metal ion to be more easily and efficiently removed due to the interaction of the substrate surface and the conductive pad 203. The addition of abrasives to the ECMP polishing composition can further improve the removal rate of the complexed metal ions due to the abrasive particles ability to increase contact area between the conductive pad 203 and the substrate surface.

Further, controlling the amounts and types of constituents of the polishing composition, such as corrosion inhibitors and oxidizers, can result in tuning the desired removal rate of the process. For example reduced amounts of corrosion inhibitor will result in an increase in the material removal rate as compared to compositions having higher corrosion inhibitor concentrations. In cases where the polishing composition does not contain corrosion inhibitors the ECMP material removal rate is greatly increased over a polishing composition which contains a corrosion inhibitor due to the formation of the metal ions and inhibitor complex which tends to shield the surface of the substrate to the electrolyte. Likewise reduced amounts of oxidizers will generally result in lower removal rates compared to compositions having higher oxidizer compositions. It has been suggested that at low concentrations of the oxidizer, the corrosion inhibitor and/or chelating agent can complex with a metal ion before it becomes oxidized further by the oxidizing agent due to kinetic effects limiting the supply of the oxidizer to the surface of the substrate. The corrosion inhibitor and metal ion complex can thus affect the removal efficiency due to the formation of the stronger attachment strength complexed metal ions. An example of a polishing composition described herein includes about 2% by volume ethylenediamine, about 2% by weight ammonium citrate, about 0.3% by weight benzotriazole, between about 0.1% and about 3% by volume or weight, for example, about 0.45% hydrogen peroxide, and/or about between about 0.01% and 1% by weight, for example 0.15% by weight, of abrasive particles, and about 6% by volume phosphoric acid. The pH of the composition is about 5, which may be achieved by, for example, the composition further including potassium hydroxide to adjust the pH to the preferred range. The remainder of the polishing composition is deionized water.

The oxidizer can be present in the polishing composition in an amount ranging between about 0.01% and about 90% by volume or weight, for example, between about 0.1% and about 20% by volume or weight. In an embodiment of the polishing composition, between about 0.1% to about 15% by volume or weight of hydrogen peroxide is present in the polishing composition. Examples of suitable oxidizers include peroxy compounds, e.g., compounds that may disassociate through hydroxy radicals, such as hydrogen peroxide and its adducts including urea hydrogen peroxide, percarbonates, and organic peroxides including, for example, alkyl peroxides, cyclical or aryl peroxides, benzoyl peroxide, peracetic acid, and di-t-butyl peroxide. Sulfates and sulfate derivatives, such as monopersulfates and dipersulfates may also be used including for example, ammonium peroxydisulfate, potassium peroxydisulfate, ammonium persulfate, and potassium persulfate. Salts of peroxy compounds, such as sodium percarbonate and sodium peroxide may also be used.

The oxidizing agent can also be an inorganic compound or a compound containing an element in its highest oxidation state. Examples of inorganic compounds and compounds containing an element in its highest oxidation state include but are not limited to periodic acid, periodate salts, perbromic acid, perbromate salts, perchloric acid, perchloric salts, perbonic acid, nitrate salts (such as cerium nitrate, iron nitrate, ammonium nitrate), perborate salts and permanganates. Other oxidizing agents include bromates, chlorates, chromates, iodates, iodic acid, and cerium (IV) compounds such as ammonium cerium nitrate.

One or more surfactants may be used in the polishing composition to increase the dissolution or solubility of materials, such as metals and metal ions or by-products produced during processing, reduce any potential agglomeration of abrasive particles in the polishing composition, improve chemical stability, and reduce decomposition of components of the polishing composition. The one or more surfactants can comprise a concentration between about 0.001% and about 10% by volume or weight of the polishing composition. A concentration between about 0.01% and about 2% by volume or weight, for example between about 0.1% and about 1% by volume or weight, of the surfactants may be used in one embodiment of the polishing composition. The one or more surfactants may include non-ionic surfactants as well as ionic surfactants including anionic surfactants, cationic surfactants, amphoteric surfactants, and ionic surfactants having more than one ionic functional group, such as Zweitter-ionic surfactants. Dispersers or dispersing agents are considered to be surfactants as surfactants are used herein.

Alternatively, the polishing composition may further include electrolyte additives including suppressors, enhancers, levelers, brighteners, stabilizers, and stripping agents to improve the effectiveness of the polishing composition in polishing of the substrate surface. For example, certain additives may decrease the ionization rate of the metal atoms, thereby inhibiting the dissolution process, whereas other additives may provide a finished, shiny substrate surface. The additives may be present in the polishing composition in concentrations up to about 15% by weight or volume, and may vary based upon the desired result after polishing.

Other examples of additives include one or more leveling agents, which are broadly defined herein as additives that suppress dissolution current on the surface of a substrate.

Leveling agents suppress dissolution current by attaching to conductive materials, by inhibiting the electrochemical reactions between the electrolyte and conductive material, and/or form depolarizing agents that limit electrochemical reactions. A concentration of leveling agents between about 0.005% and about 10% by volume or weight, for example, between about 0.05% and about 2% by volume or weight of the electrolyte solution can be used.

Leveling agents include, but are not limited to, polyethylene glycol and polyethylene glycol derivatives. Other leveling agents which can be employed in the process described herein include any employed in the electroplating art, such as polyamines, polyamides and polyimides including polyethyleneimine, polyglycine, 2-amino-1-naphthalenesulfonic acid, 3-amino-1-propanesulfonic acid, 4-aminotoluene-2-sulfonic acid.

Suppressors, such as electrically resistive additives that reduce the conductivity of the polishing composition may be added to the composition in an amount between about 0.005% and about 2% by volume or weight of the composition. Suppressors include polyacrylamide, polyacrylic acid polymers, polycarboxylate copolymers, coconut diethanolamide, oleic diethanolamide, ethanolamide derivatives, or combinations thereof.

One or more stabilizers may be present in an amount that is sufficient to produce measurable improvements in composition stability. The one or more stabilizers may be present in an amount ranging from about 100 ppm to about 5.0 weight percent (wt. %). Non-limiting examples of preferred stabilizers include but are not limited to phosphoric acids and phosphoric acid derivatives including aminotri(methylenephosphonic) acid, 1-hydroxyethylidene-4-diphosphonic acid, hexamethylenediaminetetramethylene phosphoric acid, and diethylenetetramine pentamethylenephosphonic acid, and derivative salts thereof.

Accelerators are another example of an additive that may be included in the polishing composition. Accelerators increase electrochemical reactions of metals disposed on the substrate surface to increase metal removal. The composition may include one or more accelerators at a concentration between about 0.001% and about 1% by volume or weight, for example, between about 0.25 and about 0.8% by volume or weight. Accelerators may include sulfur containing compounds, such as sulfite or di-sulfate.

Further examples of additives to the polishing composition are more fully described in U.S. patent application No. 10/141,459, filed on May 7, 2002, now U.S. Pat. No. 6,863,797, which is incorporated by reference herein to the extent not inconsistent with the claimed aspects and disclosure herein.

The balance or remainder of the polishing compositions described above is a solvent, such as a polar solvent, including water, preferably deionized water, and organic solvents, for example, alcohols or glycols.

It has been observed that a substrate processed with the polishing composition described herein has improved surface finish, including less surface defects, such as dishing, erosion (removal of dielectric material surrounding metal features), and scratches, as well as improved planarity.

Power Application and Processing

Power may be applied to the substrate having a conductive material layer formed thereon in a process apparatus, such as cell 200 described above, by applying a bias between an electrode 209 and the substrate 208 to remove the conductive material.

In an example of an ECMP polishing process of the present invention, a substrate 208 is disposed in the polishing head 202 used in a planarization process as shown in FIG. 1. The polishing head 202 applies pressure to the substrate 208, which is in contacts with the pad assembly 222, in a range between about 0.01 psi and about 2 psi. Preferably between about 0.1 psi and about 0.5 psi.

The polishing pad assembly 222 is disposed in a basin containing an electrolyte described herein. The substrate 208 is exposed to the polishing composition and electrically contacted with conductive pad 203. A bias from a power source 224 is then applied between the substrate 208 and the electrode 209. The bias is generally provided to produce anodic dissolution of the conductive material from the surface of the substrates at a current density up to about 100 milliamps/cm$^2$ for substrates up to about 300 mm in diameter. For example, between about 0.01 and about 40 milliamps/cm$^2$ for a 200 mm substrate.

The bias may be varied in power and application depending upon the user requirements in removing material from the substrate surface. The bias may also be applied by an electrical pulse modulation technique, which applies a constant current density or voltage for a first time period, then applies a constant reverse current density or voltage for a second time period, and repeats the first and second steps, as is described in co-pending U.S. Pat. No. 6,379,223, entitled "Method And Apparatus For Electrochemical Mechanical Planarization", issued on Apr. 22, 2002, which is incorporated by reference herein to the extent not inconsistent with the claimed aspects and disclosure herein.

By use of the current invention by biasing the substrate surface, containing copper material, a removal rate of about 15,000 Å/min of can be achieved. Higher removal rates are generally desirable, but due to the goal of maximizing process uniformity and other process variables (e.g., reaction kinetics at the anode and cathode) it is common for dissolution rate to be controlled between about 100 Å/min and about 15,000 Å/min. In one embodiment of the invention where the copper material to be removed is less than 5,000 Å thick, the voltage (or current) may be applied to provide a removal rate between about 100 Å/min and about 5,000 Å/min. The substrate is typically exposed to the polishing composition and power application for a period of time sufficient to remove at least a portion or all of the desired material disposed thereon.

While there are many theories as to the exact mechanism behind the ECMP planarization process, it is believed that the planarization process occurs as follows. A passivation layer, which chemically and/or electrically insulates the surface of the substrate, is formed from the exposure of the substrate surface to the corrosion inhibitor, or other materials capable of forming a passivating or insulating film, for example oxidizers, chelating agents and/or additives. An electrical bias is applied to enhance the electrochemical dissolution of the surface material, such as copper, from the substrate surface. By use of mechanical means to disturb the passivation layer on the surface of the substrate, such as the polishing head 202 urging the substrate against the conductive pad 203, a region of unpassivated material is exposed. The process of exposing the underlying substrate surface enhances electrochemical dissolution and/or chemical interaction in these newly exposed regions. The exposed regions will remain exposed for short a period of time before the passivation layer is formed -again, which thus tends to regulate the dissolution process in the various localized areas. The passivation layer is retained in areas not in contact with the conductive pad 203, such as recesses or valleys on the substrate surface, and thus the dissolution and chemical interaction is minimized. The addition of inorganic or organic abrasive component(s), even at low to moderate pad pressures, tends to improve the dissolution rate further, (than without the addition of the abrasive particles) likely due to the increased ability of the conductive pad 203 to disturb and expose the underlying substrate surface. The high points on topography formed during prior semiconductor processes and any surface roughness created due to preferential electrochemical dissolution (e.g. etching along grain boundaries) or chemical attack, the contact of the abrasive and conductive pad 203 surfaces will tend to disturb the passivating layer on the highest points allowing preferential etching of these exposed areas. The exposure of the high points to increased electrochemical etching thus tends to reduce localized roughness and tends to planarize the surface of the substrate. Preferential attack of localized roughness will also have the property of improving the surface finish of the substrate. It has been found that using the above mentioned chemistry and a oxidizing agent and/or abrasive particles at a pad pressure of approximately 0.5 psi the overall dissolution (or etch) rate has been increased by a factor of nearly two.

Further, even though the pressure applied to the substrate tends to be below a value that would tend to generate appreciable convention mechanical polishing abrasion (e.g., about 2 psig or less), the addition of the abrasives may still also tend to deform or abrade localized surface roughness highpoints thus further improving the surface finish of the polished substrate. Lower polishing pressures correspond to lower shear forces and frictional forces which make this process suitable for planarizing substrate surfaces sensitive to contact pressures between the substrate and conductive pad 203, such as low k dielectric materials, with reduced or minimal deformations and defect formation from polishing. Further, the lower shear forces and frictional forces have been observed to reduce or minimize formation of topographical defects, such as dishing and scratches, during polishing.

EXAMPLES

Baseline Example

In an embodiment of the present invention the substrate 208 is placed in a polishing composition containing an acid based electrolyte system, one or more chelating agents, one or more corrosion inhibitors, one or more pH adjusting agents, one or more additives, and a solvent or combination thereof. The substrate surface is anodically biased relative to the electrode 209 by use of the power supply 200 to a voltage of about 2.9 volts. A pressure of 0.2 psi is applied to the substrate by the polishing head 202, pushing it against the conductive pad 203. The substrate 208 and the conductive pad 203 are moved relative to each other. The combination of the above elements of this embodiment can deliver a material removal rate of about 4000 Angstroms per minute. One will note that the magnitude of the bias voltage applied between the electrode 209 and the substrate 208 to achieve this material removal rate, is dependent on many factors including the electrolyte conductivity and the distance between the electrode 209 and the substrate 208. An example of a possible polishing composition is shown in Example 1 in the Composition Examples shown below.

Oxidizing Agent Example

In another embodiment an oxidizing agents is added to the polishing composition of the Baseline Example described above, which changes the attachment strength of the complexed metal ion to the surface of the substrate. Due to weaker attachment force of the complexed metal ions, due to the presence of the oxidizing agent, the material removal rate can be increased even if the applied pressure and bias voltage are held constant relative to the Baseline Example (shown above). At a pressure of 0.2 psi a removal rate of about 6000 Angstroms per minute has been achieved. An example of a possible polishing composition for this embodiment is shown in Example 2 in the Composition Examples shown below.

Abrasive Particle Example

In yet another embodiment abrasive particles are added to the polishing composition of the Baseline Example described above. In this embodiment an improved surface finish and material removal rate can be achieved, even if the applied pressure and bias voltage are held constant, relative to the Baseline Example. The increased material removal rate and improved surface finish is likely due to the increased contact area between the conductive pad 203 and the substrate surface. The increased contact area appears to help to more efficiently remove the complexed metal ions even though they may have a high attachment strength. At a pressure of 0.2 psi and similar bias voltage as the Baseline Example, a removal rate of about 4800 Angstroms per minute can be achieved. The surface finish achieved using this embodiment is comparable (same order of magnitude) to a surface finish found by use of a conventional CMP process. An example of a possible polishing composition for this embodiment is shown in Example 3 in the Composition Examples shown below.

Oxidizing Agent and Abrasive Particle Example

In yet another embodiment, abrasive particles and one or more oxidizing agents are added to the polishing composition of the Baseline Example to increase the removal rate and produce a better surface finish. This can be achieved even though the applied pressure and bias voltage are held constant, relative to the Baseline Example shown above. A pressure of 0.2 psi and similar bias voltage can achieve a removal rate of about 6000 Angstroms per minute while achieving a surface finish comparable to a conventional CMP process. An example of a possible polishing composition for this embodiment is shown in Example 4 in the Composition Examples shown below.

Therefore, one feature of the present invention is that it makes it possible to adjust the pad pressure and polishing composition components to enhance the material removal rate, while minimizing the formation of topographical defects.

Composition Examples

The following non-limiting examples are provided to further illustrate embodiments of the invention. However, the examples are not intended to be all inclusive and are not intended to limit the scope of the invention described herein.

Example 1

A copper plated substrate was polished and planarized using the following polishing composition within a modified cell on a Reflection® system, available from Applied Materials, Inc. of Santa Clara, Calif.

about 6% by volume phosphoric acid;
about 2% by volume ethylenediamine;
about 2% by weight ammonium citrate;
about 0.3% by weight benzotriazole;
between about 2% and about 6% by volume of potassium hydroxide to provide a pH of about 5; and
deionized water.

Example 2

A copper plated substrate was polished and planarized using the following polishing composition within a modified cell on a Reflection® system, available from Applied Materials, Inc. of Santa Clara, Calif.
about 6% by volume phosphoric acid;
about 2% by volume ethylenediamine;
about 2% by weight ammonium citrate;
about 0.3% by weight benzotriazole;
between about 2% and about 6% by volume of potassium hydroxide to provide a pH of about 5;
about 0.45% by volume of hydrogen peroxide; and
deionized water.

Example 3

A copper plated substrate was polished and planarized using the following polishing composition within a modified cell on a Reflection® system, available from Applied Materials, Inc. of Santa Clara, Calif.
about 6% by volume phosphoric acid;
about 2% by volume ethylenediamine;
about 2% by weight ammonium citrate;
about 0.3% by weight benzotriazole;
between about 2% and about 6% by volume of potassium hydroxide to provide a pH of about 6;
about 0.1% by weight of silica ($SiO_2$) abrasive particles; and
deionized water.

Example 4

A copper plated substrate was polished and planarized using the following polishing composition within a modified cell on a Reflection® system, available from Applied Materials, Inc. of Santa Clara, Calif.
about 6% by volume phosphoric acid;
about 2% by volume ethylenediamine;
about 2% by weight ammonium citrate;
about 0.3% by weight benzotriazole;
between about 2% and about 6% by volume of potassium hydroxide to provide a pH of about 5;
about 0.45% by volume of hydrogen peroxide;
about 0.15% by weight of silica ($SiO_2$) abrasive particles; and
deionized water.

While the foregoing is directed to embodiments of the present invention, other and further embodiments of the invention may be devised without departing from the basic scope thereof, and the scope thereof is determined by the claims that follow.

What is claimed is:

1. A composition for removing at least a conductive material from a substrate surface, the composition produced by a process comprising:
   combining a phosphoric acid based electrolyte system with one or more corrosion inhibitors, one or more organic acid salts, and a solvent; and
   adding one or more basic pH adjusting agents to the phosphoric acid based electrolyte system to provide a pH between about 2 and about 10.

2. The composition of claim 1, wherein the phosphoric acid based electrolyte system comprising a phosphoric acid, or a phosphoric acid salt selected from the group consisting of potassium phosphate $K_xPO_4$), copper phosphate, ammonium dihydrogen phosphate (($NH_4)_2H_2PO_4$), and diammonium hydrogen phosphate (($NH_4)HPO_4$), wherein x is 1, 2, or 3.

3. The composition of claim 1, further comprising adding between about 0.005% and about 10% by volume or weight of a leveling agent to the phosphoric acid based electrolyte system.

4. The composition of claim 3, wherein the leveling agent comprises a material selected from the group consisting of polyethylene glycol, polyethylene glycol derivatives, polyamines, polyamides, polyimides, polyethyleneimine, polyglycine, 2-amino-1-naphthalenesulfonic acid, 3-amino-1-propanesulfonic acid, 4-aminotoluene-2-sulfonic acid, and combinations thereof.

5. The composition of claim 1, wherein the one or more corrosion inhibitors have one or more azole groups.

6. The composition of claim 5, wherein the one or more corrosion inhibitors are selected from the group consisting of benzotriazole, imidazole, benzimidazole, triazole, and derivatives of benzotriazole, imidazole, benzimidazole, triazole, with hydroxy, amino, imino, carboxy, mercapto, nitro and alkyl substituted groups, and combinations thereof.

7. The composition of claim 1, wherein the one or more organic salts comprises ammonium salts of organic acids, potassium salts of organic acids, or combinations thereof.

8. The composition of claim 7, wherein the one or more organic salts are selected from the group consisting of ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof.

9. The composition of claim 1, wherein the one or more basic pH adjusting agents comprise:
   one or more bases selected from the group consisting of potassium hydroxide, ammonium hydroxide, and combinations thereof.

10. The composition of claim 1, wherein the composition further comprises inorganic abrasives, polymeric abrasives, polymeric coated abrasives, or combinations thereof.

11. The composition of claim 1, further comprising adding one or more oxidizers selected from the group consisting of peroxy compounds, salts of peroxy compounds, organic peroxides, sulfates, derivatives of sulfates, compounds containing an element in the highest oxidation state, and combinations thereof to the phosphoric acid based electrolyte system.

12. The composition of claim 1, wherein the composition is formed by combining:
   between about 1% and about 30% by weight (wt. %) of one or more phosphoric acid based electrolytes in the total volume of solution;
   between about 0.01% and about 1.0% by volume or weight of the one or more corrosion inhibitors in the total volume of solution;
   between about 0.1% and about 15% by volume or weight of the one or more organic acid salts in the total volume of solution;

between about 0.1% and about 25% by volume or weight of the basic pH adjusting agent in the total volume of solution;

between about 0.005% and about 10% by volume or weight of a leveling agent; and the remainder a solvent.

13. The composition of claim 12, wherein the composition is formed by further combining between about 0.1% and about 25% by volume or weight of one or more oxidizers.

14. The composition of claim 12, wherein the composition further comprises:

between about 0.001% and about 30% by weight of abrasive particles in the total volume of solution.

15. The composition of claim 1, wherein the composition initially comprises:

about 6% by volume phosphoric acid;
about 0.3% by weight benzotriazole;
about 2% by weight ammonium citrate;
between about 2% and about 6% by volume of potassium hydroxide to provide a pH between about 2 and about 10;
between about 0.005% and about 10% by volume or weight of a leveling agent; and
deionized water.

16. The composition of claim 1, wherein the composition initially comprises:

between about 1% and about 30% by weight potassium phosphate;
about 2% by volume ethylenediamine;
about 0.3% by weight benzotriazole;
about 2% by weight ammonium citrate;
between about 2% and about 6% by volume of potassium hydroxide to provide a pH of between about 2 and about 10; and
deionized water.

17. The composition of claim 1, produced by the process of adding one or more surfactants selected from the class of ionic surfactants, cationic surfactants, amphoteric surfactants, and ionic surfactants having more than one ionic functional group, such as Zwitter-ionic surfactants to the phosphoric acid based electrolyte system.

18. The composition of claim 1, produced by the process of adding one or more additives including level suppressors, accelerators, brighteners or compositions thereof to the phosphoric acid based electrolyte system.

19. The composition of claim 1, wherein the adding one or more basic pH adjusting agents provides a pH between about 4 and about 6.

20. A method of processing a substrate, comprising:

disposing a substrate having a conductive material layer formed thereon in a process apparatus comprising a first electrode and a second electrode, wherein the substrate is in electrical contact with the second electrode;

providing a polishing composition between the first electrode and the substrate, wherein the polishing composition is produced by a process comprising:

combining a phosphoric acid based electrolyte system with one or more corrosion inhibitors, one or more organic acid salts, and a solvent;

adding one or more basic pH adjusting agents to the phosphoric acid based electrolyte system to provide a pH between about 2 and about 10;

applying a pressure between the substrate and a pad by use of a polishing head;

providing relative motion between the substrate and the pad by mechanical means;

applying a bias between the first electrode and the second electrode; and removing conductive material from the conductive material layer.

21. The method of claim 20, wherein the bias is applied to the substrate to initiate an anodic dissolution at a current density between about 0.01 milliamps/cm$^2$ and about 100 milliamps/cm$^2$.

22. The method of claim 20, wherein the phosphoric acid based electrolyte system initially comprises a phosphoric acid, or a phosphoric acid salt selected from the group consisting of potassium phosphate ($K_xPO_4$), copper phosphate, ammonium dihydrogen phosphate (($NH_4)_2H_2PO_4$), and diammonium hydrogen phosphate (($NH_4)HPO_4$), wherein x is 1, 2, or 3.

23. The method of claim 20, wherein the composition is produced by the process of adding between about 0.005% and about 10% by volume or weight of a leveling agent to the phosphoric acid based electrolyte system.

24. The method of claim 23, wherein the the leveling agent comprises a material selected from the group consisting of polyethylene glycol, polyethylene glycol derivatives, polyamines, polyamides, polyimides, polyethyleneimine, polyglycine, 2-amino-1-naphthalenesulfonic acid, 3-amino-1-propanesulfonic acid, 4-aminotoluene-2-sulfonic acid, and combinations thereof.

25. The method of claim 20, wherein the one or more corrosion inhibitors have one or more azole groups.

26. The method of claim 25, wherein the one or more corrosion inhibitors are selected from the group consisting of benzotriazole, imidazole, benzimidazole, triazole, and derivatives of benzotriazole, imidazole, benzimidazole, triazole, with hydroxy, amino, imino, carboxy, mercapto, nitro and alkyl substituted groups, and combinations thereof.

27. The method of claim 20, wherein the one or more organic salts comprises ammonium salts of organic acids, potassium salts of organic acids, or combinations thereof.

28. The method of claim 27, wherein the one or more organic salts are selected from the group consisting of ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof.

29. The method of claim 20, wherein the one or more basic pH adjusting agents comprise:

one or more bases selected from the group consisting of potassium hydroxide, ammonium hydroxide, and combinations thereof.

30. The method of claim 20, wherein the composition further comprises inorganic abrasives, polymeric abrasives, polymeric coated abrasives, or combinations thereof.

31. The method of claim 20, wherein the composition is produced by the process of adding one or more oxidizers selected from the group consisting of peroxy compounds, salts of peroxy compounds, organic peroxides, sulfates, derivatives of sulfates, compounds containing an element in the highest oxidation state, and combinations thereof to the phosphoric acid based electrolyte system.

32. The method of claim 20, wherein the composition initially comprises:

between about 1% and about 30% by weight (wt.%) of one or more phosphoric acid based electrolytes in the total volume of solution;

between about 0.01% and about 1.0% by volume or weight of the one or more corrosion inhibitors in the total volume of solution;

between about 0.1% and about 15% by volume or weight of the one or more organic acid salts in the total volume of solution;
between about 0.1% and about 25% by volume or weight of the basic pH adjusting agent in the total volume of solution;
between about 0.005% and about 10% by volume or weight of a leveling agent; and
the remainder a solvent.

33. The method of claim 32, further comprising between about 0.1% and about 25% by volume or weight of the one or more oxidizers.

34. The method of claim 32, wherein the composition further comprises:
between about 0.001% and about 30% by weight of abrasive particles in the total volume of solution.

35. The method of claim 20, wherein the composition initially comprises:
about 6% by volume phosphoric acid;
about 0.3% by weight benzotriazole;
about 2% by weight ammonium citrate;
between about 2% and about 6% by volume of potassium hydroxide to provide a pH between about 2 and about 10;
between about 0.005% and about 10% by volume or weight of a leveling agent; and
deionized water.

36. The method of claim 20, wherein the composition initially comprises:
between about 1% and about 30% by weight potassium phosphate;
about 2% by volume ethylenediamine;
about 0.3% by weight benzotriazole;
about 2% by weight ammonium citrate;
between about 2% and about 6% by volume of potassium hydroxide to provide a pH between about 2 and about 10; and
deionized water.

37. The method of claim 20, wherein the pressure applied between the substrate and pad is between about 0.01 and about 2 psi.

38. The method of claim 20, wherein the pressure applied between the substrate and pad is between about 0.1 psi and about 0.5 psi.

39. The method of claim 20, wherein the abrasive is polymeric and facilitates material removal due to chemical modification of the substrate surface.

40. The method in claim 39, wherein the polymeric abrasive is selected from an amine group, a carboxylate group, a pyridine group, a hydroxide group, ligands with a high affinity for copper, chelating agents, or combinations thereof.

41. The method of claim 20, wherein the adding one or more basic pH adjusting agents provides a pH between about 4 and about 6.

42. A method of processing a substrate, comprising:
disposing a substrate having a conductive material layer formed thereon in a process apparatus comprising a first electrode and a second electrode, wherein the substrate is in electrical contact with the second electrode;
providing a polishing composition between the first electrode and the substrate, wherein the polishing composition is produced by a process comprising:
combining a phosphoric acid based electrolyte system with one or more corrosion inhibitors, one or more organic acid salts, and a solvent;
adding one or more basic pH adjusting agents to the phosphoric acid based electrolyte system to provide a pH between about 2 and about 10;
applying a pressure between the substrate and the second electrode by use of a polishing head;
providing relative motion between the substrate and the second electrode by mechanical means;
applying a bias between the first electrode and the second electrode; and
removing conductive material from the conductive material layer.

43. The method of claim 40, wherein the bias is applied to the substrate to initiate an anodic dissolution at a current density between about 0.01 milliamps/cm$^2$ and about 100 milliamps/cm$^2$.

44. The method of claim 42, wherein the phosphoric acid based electrolyte system comprising a phosphoric acid, or a phosphoric acid salt selected from the group consisting of potassium phosphate ($K_xPO_4$), copper phosphate, ammonium dihydrogen phosphate (($NH_4)_2H_2PO_4$), and diammonium hydrogen phosphate (($NH_4)HPO_4$, wherein x is 1, 2, or 3.

45. The method of claim 42, further comprising adding between about 0.005% and about 10% by volume or weight of a leveling agent to the phosphoric acid based electrolyte system.

46. The method of claim 45, wherein the leveling agent comprises a material selected from the group consisting of polyethylene glycol, polyethylene glycol derivatives, polyamines, polyamides, polyimides, polyethyleneimine, polyglycine, 2-amino-1-naphthalenesulfonic acid, 3-amino-1-propanesulfonic acid, 4-aminotoluene-2-sulfonic acid, and combinations thereof.

47. The method of claim 42, wherein the one or more corrosion inhibitors have one or more azole groups.

48. The method of claim 47, wherein the one or more corrosion inhibitors are selected from the group consisting of benzotriazole, imidazole, benzimidazole, triazole, and derivatives of benzotriazole, imidazole, benzimidazole, triazole, with hydroxy, amino, imino, carboxy, mercapto, nitro and alkyl substituted groups, and combinations thereof.

49. The method of claim 42, wherein the one or more organic salts comprises ammonium salts of organic acids, potassium salts of organic acids, or combinations thereof.

50. The method of claim 49, wherein the one or more organic salts are selected from the group consisting of ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof.

51. The method of claim 42, wherein the one or more basic pH adjusting agents comprise:
one or more bases selected from the group consisting of potassium hydroxide, ammonium hydroxide, and combinations thereof.

52. The method of claim 42, wherein the composition further comprises inorganic abrasives, polymeric abrasives, polymeric coated abrasives, or combinations thereof.

53. The method of claim 42, wherein the composition is produced by the process of adding one or more oxidizers selected from the group consisting of peroxy compounds, salts of peroxy compounds, organic peroxides, sulfates, derivatives of sulfates, compounds containing an element in the highest oxidation state, and combinations thereof to the phosphoric acid based electrolyte system.

54. The method of claim 42, wherein the composition initially comprises:
- between about 1% and about 30% by weight (wt.%) of one or more phosphoric acid based electrolytes in the total volume of solution;
- between about 0.01% and about 1.0% by volume or weight of the one or more corrosion inhibitors in the total volume of solution;
- between about 0.1% and about 15% by volume or weight of the one or more organic acid salts in the total volume of solution;
- between about 0.1% and about 25% by volume or weight of the basic pH adjusting agent in the total volume of solution;
- between about 0.005% and about 10% by volume or weight of a leveling agent; and
- the remainder a solvent.

55. The method of claim 54, further comprising between about 0.1% and about 25% by volume or weight of the one or more oxidizers.

56. The method of claim 51, wherein the composition further comprises:
- between about 0.001% and about 30% by weight of abrasive particles in the total volume of solution.

57. The method of claim 42, wherein the composition comprises:
- about 6% by volume phosphoric acid;
- about 0.3% by weight benzotriazole;
- about 2% by weight ammonium citrate;
- between about 2% and about 6% by volume of potassium hydroxide to provide a pH between about 2 and about 10;
- between about 0.005% and about 10% by volume or weight of a leveling agent; and
- deionized water.

58. The method of claim 42, wherein the composition initially comprises:
- between about 1% and about 30% by weight potassium phosphate;
- about 2% by volume ethylenediamine;
- about 0.3% by weight benzotriazole;
- about 2% by weight ammonium citrate;
- between about 2% and about 6% by volume of potassium hydroxide to provide a pH between about 2 and about 10; and
- deionized water.

59. The method of claim 42, wherein the pressure applied between the substrate and pad is between about 0.01 and about 2 psi.

60. The method of claim 42, wherein the pressure applied between the substrate and pad is between about 0.1 psi and about 0.5 psi.

61. The method of claim 42, wherein the abrasive is polymeric and facilitates material removal due to chemical modification of the substrate surface.

62. The method in claim 61, wherein the polymeric abrasive is selected from an amine group, a carboxylate group, a pyridine group, a hydroxide group, ligands with a high affinity for copper, chelating agents, or combinations thereof.

63. The method of claim 42, wherein the adding one or more basic pH adjusting agents provides a pH between about 4 and about 6.

* * * * *

UNITED STATES PATENT AND TRADEMARK OFFICE
CERTIFICATE OF CORRECTION

PATENT NO. : 7,232,514 B2
APPLICATION NO. : 10/456220
DATED : June 19, 2007
INVENTOR(S) : Liu et al.

It is certified that error appears in the above-identified patent and that said Letters Patent is hereby corrected as shown below:

In Section (66) under Related U.S. Application Data:

In Line 1, please delete "Substitute for" and insert --continuation-in-part of--.

In Section (56) References Cited:

Under OTHER PUBLICATIONS, please insert the following:

--PCT Written Opinion for PCT/US03/06058, dated February 13, 2004. (AMAT/5699-PC.02)--

--PCT International Preliminary Examination Report for PCT/US02/04806, dated September 7, 2004. (AMAT/5699.PC)--

--PCT International Preliminary Examination Report for PCT/US03/06058, dated September 7, 2004. (AMAT/5699.PC.02)--

In Section (57) Abstract:

In Line 10, please delete "an conductive" and insert --a conductive--.

In the Specification:

In Column 2, Line 67, please delete "are therefore" and insert --is therefore--;

In Column 3, Line 3, please insert --Figure 1 is a cross-sectional view of one embodiment of a polishing process station.--;

In Column 7, Line 34, please delete "contains" and insert --contain--.

In Column 7, Line 58, please delete "tri-carbdxylate" and insert --tri-carboxylate--;

In Column 14, Line 5, please delete "contacts" and insert --contact--;

In Column 14, Line 33, please delete "of";

In Column 14, Line 63, please delete "short a" and insert --a short--;

UNITED STATES PATENT AND TRADEMARK OFFICE
CERTIFICATE OF CORRECTION

PATENT NO. : 7,232,514 B2
APPLICATION NO. : 10/456220
DATED : June 19, 2007
INVENTOR(S) : Liu et al.

It is certified that error appears in the above-identified patent and that said Letters Patent is hereby corrected as shown below:

In the Specification:

In Column 15, Line 20, please delete "a oxidizing" and insert --an oxidizing--;

In Column 15, Line 66, please delete "agents" and insert --agent--.

In the Claims:

In Column 18, Claim 2, Line 7, please delete "$K_xPO_4$)," and insert --($K_xPO_4$),--;

In Column 22, Claim 43, Line 12, please delete "40" and insert --42--;

In Column 22, Claim 44, Line 21, please delete "(($NH_4$)$HPO_4$," and insert --(($NH_4$)$HPO_4$),--;

In Column 23, Claim 56, Line 20, please delete "51" and insert --54--.

Signed and Sealed this

Eleventh Day of September, 2007

JON W. DUDAS
*Director of the United States Patent and Trademark Office*